(12) United States Patent
Houda et al.

(10) Patent No.: US 6,276,992 B1
(45) Date of Patent: Aug. 21, 2001

(54) METHOD OF FORMING A GROOVE IN A SURFACE OF A MOTHER SUBSTRATE

(75) Inventors: Masuyoshi Houda, Toyama; Masaya Wajima, Shinminato, both of (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/212,884

(22) Filed: Dec. 16, 1998

(30) Foreign Application Priority Data

Feb. 16, 1998 (JP) .................................................. 10-051337

(51) Int. Cl.$^7$ ....................................................... B24B 1/00
(52) U.S. Cl. ................................ 451/29; 451/30; 451/31; 451/38
(58) Field of Search .................................. 451/38, 39, 40, 451/29, 30, 31, 75, 82

(56) References Cited

U.S. PATENT DOCUMENTS

| | | | | |
|---|---|---|---|---|
| 4,430,416 | * | 2/1984 | Goto et al. ............................... | 451/29 |
| 5,069,004 | * | 12/1991 | Gillenwater ............................. | 451/29 |
| 5,629,132 | * | 5/1997 | Suzuki et al. .......................... | 430/258 |
| 5,916,738 | * | 6/1999 | Takehana et al. ...................... | 451/31 |
| 5,924,901 | * | 7/1999 | Takehana et al. ...................... | 451/29 |
| 6,037,106 | * | 3/2000 | Komatsu ................................. | 451/31 |

\* cited by examiner

*Primary Examiner*—Eileen P. Morgan
(74) *Attorney, Agent, or Firm*—Keating & Bennett, LLP

(57) ABSTRACT

A method of forming a groove on a mother material substrate includes the steps of forming a first layer on a surface of the mother material substrate, the first layer including a chain-polymer material which is soluble in an organic solvent. Then a second layer is formed on the first layer except for a portion where the groove is to be formed. The second layer includes a chain-polymer material having very high resistance to sand blasting. Then a groove is formed by cutting the first layer and the mother material substrate at the portion where the groove is to be formed, by a sand blasting process in which sand is directed from above the second layer downwardly. Then the first and second layers are removed from the mother material by dissolving the first layer using the organic solvent.

20 Claims, 1 Drawing Sheet

① Ceramic Substrate
FIG. 1A
② ER Ink Printing
FIG. 1B
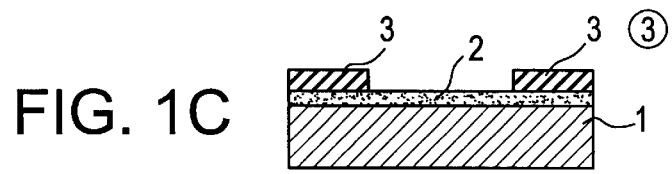
③ Silicone Printing
FIG. 1C
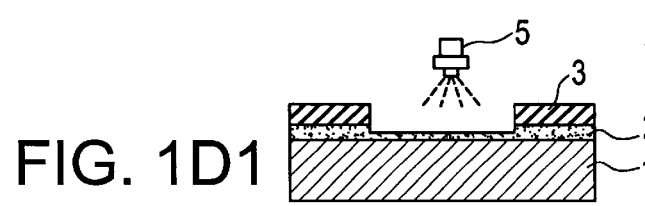
④ Sandblast Process
FIG. 1D1
FIG. 1D2
FIG. 1D3
⑤ ER Etching
FIG. 1E
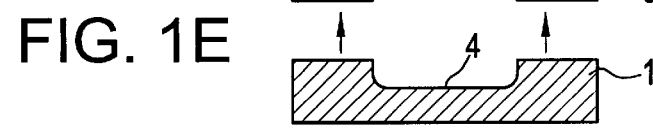
⑥ Finished Products
FIG. 1F

METHOD OF FORMING A GROOVE IN A SURFACE OF A MOTHER SUBSTRATE

BACKGROUND OF THE INVENTION

This invention relates to a method of forming a fine groove in a surface of a mother substrate, such as a ceramic substrate.

DESCRIPTION OF THE RELATED ART

Conventionally, a chip-type piezoelectric resonator or similar component is formed such that a groove is formed in a surface of a ceramic sealing substrate which is to be bonded on both sides of a piezoelectric substrate. By forming the groove, a space allowing for free and unhindered vibration of the piezoelectric substrate is provided. Such a chip-type piezoelectric resonator is disclosed in Japanese Utility Patent Publication No. 7-49860, for example.

Such a ceramic substrate having a groove is initially formed using a press die etc., to form a green sheet which is later baked or fired.

However, there has been a problem that the dimensional accuracy of the groove is not sufficient, because of the shrinkage of the ceramic substrate which occurs during baking.

To solve this problem, a method of forming a groove via sand blasting has been considered. In such a sand blasting process, the surface of a mother substrate is masked by a protective film at locations where the groove will not be formed and a groove is formed by a sand blasting from above the mother substrate.

In this case, silicone or urethane resin is used for the protective film for sand blasting. However, if the silicone or urethane are printed and hardened directly on the mother substrate, the silicone or urethane resin cannot be peeled off of the mother substrate.

There is also a method of masking using thermoplastic ink that has been attempted. In this case, there is an advantage that the resin can be peeled off of the mother sheet by using a solvent. However, the thermoplastic ink does not have sufficient durability to protect the mother sheet during the sand blasting process, and the thermoplastic ink will be easily removed during the sand blasting process. For this reason, the thermoplastic ink cannot be used as a masking material.

In another related method, a photosensitive film for use in a sand blasting process is disclosed in Japanese Laid-Open Unexamined Patent Publication No. 6-161098. This photosensitive film is formed by laminating a water-soluble-resin layer, a photosensitive resin composition layer which includes urethane oligomer as a main component and a cellulose derivative, and a peeling film, on a flexible film, sequentially. However, in this case, since many complicated processes such as pasting a film on a mother material, pasting a mask pattern, exposing and removing a mask pattern, image development, sand blasting, and film peeling are needed, this method cannot be applied to a manufacturing process for making a small-sized component. Moreover, since sand-blast-resistancy and peelability are contrary characteristics, there are problems with finding a material that satisfies both of these important characteristics.

SUMMARY OF THE INVENTION

To solve the problems described above, preferred embodiments of the present invention provide a method of forming a groove on a surface of a mother material which achieves formation of a fine and accurately formed groove by using two different layers made of a material that has a very high resistance to sand blasting and that has excellent peelability, respectively.

A preferred embodiment of the present invention provides a method of forming a groove in a mother substrate including the steps of forming a first layer on a surface of the mother substrate, the first layer including a chain-polymer material which is soluble in an organic solvent, forming a second layer on the first layer except for a portion where the groove is to be formed, the second layer including a chain-polymer material having very high resistance to sand-blasting, forming the groove by cutting the first layer and the mother substrate at the portion where the groove is to be formed via a blast process in which blasting material is directed onto the mother substrate from above the second layer, and removing the first and second layers from the mother material by dissolving the first layer by applying the organic solvent to the first and second layers.

In the above-described method, the material used for the mother substrate may include one selected from the group consisting of a ceramic substrate, a glass substrate, a printed circuit board, a wafer and a stone. The first layer may preferably be formed of a thermoplastic resin. Further, the second layer may preferably include a thermosetting resin of silicone or urethane.

According to the above-described method, the first layer and the second layer are peeled off and removed from the mother substrate by applying the organic solvent. Therefore, compared with the conventional method in which a photosensitive sheet is used, a fine groove in a mother substrate can be accurately formed with fewer steps and much more economically than prior art methods.

Further, the second layer reliably provides a necessary blast-proof property and the first layer reliably provides a necessary peelability. Therefore, the resistance to sandblasting and peelability can be reconciled and thereby, a groove forming method having excellent operability is obtained.

As described above, the first layer including a chain-polymer material which has excellent solubility in an organic solvent is formed along the entire surface of a mother substrate. It is very important for the chain-polymer material used to form the first layer have removability (solubility in the organic solvent) and not to have blast-resistancy or resistance to sand-blasting. For example, thermoplastic ink such as etching-resist ink or other suitable ink material is preferably used for the chain-polymer material.

Next, the pattern formation of the second layer including cross-linked polymer material which has a very high blast-resistancy is formed on the first layer except for an area where the groove is to be formed. The pattern formation may be done via a printing method, a photo-etching method, or other methods which are suitable for fine processing. For the second layer, a material which does not dissolve in an organic solvent and has excellent blast-resistance is used. The material for the second layer preferably includes a thermosetting resin such as silicone or urethane system, and a photosensitive polymer-such as UV resin, etc.

After formation of the first and second layers, a sand blasting process is performed, with sand being blasted onto the first and second layers from above the second layer. Because the portion except for the area where the groove is to be formed is protected by the second layer, only the area where the groove is to be formed where only the first layer and the mother material are present are cut. As a blast process, a water blast as well as a sand blast may be used.

Next, the mother substrate having the first and second layers remaining thereon after the blast process has been completed, is etched by the organic solvent. The first layer dissolves and the second layer separates from the mother substrate easily. Thus, a groove is accurately and easily formed on the mother substrate. As an organic solvent, thinner, acetone, or other suitable material can be used, for example. As a mother material, any material is suitable as long as it is capable of having a groove formed therein via a blast process, such as a ceramic substrate, a glass substrate, a printed circuit board, a wafer, or a stone.

Other features and advantages of the present invention will become apparent from the following description of preferred embodiments of the present invention which refers to the accompanying drawings.

BRIEF EXPLANATION OF THE DRAWINGS

FIGS. 1A, 1B, 1C, 1D1, 1D2, 1D3, 1E and 1F are drawings showing a preferred embodiment of the present invention of a method of forming a groove on a surface of a mother material.

DETAILED DESCRIPTION OF PREFERRED EMBODIMENTS

First, a ceramic substrate 1 which is a mother substrate made of a mother material as shown in FIG. 1A is prepared. The surface of the ceramic substrate 1 is preferably formed so as to be even and smooth.

Next, as shown in FIG. 1B, a first layer 2 including a chain polymer material which has excellent solubility in an organic solvent such as ER ink etc. is formed on substantially the whole surface of the ceramic substrate 1. It is preferable to form the first layer to have a thin film shape having a thickness of, for example, about 5–10 micrometers so that first layer 2 can be easily cut by a blast process performed later such that a necessary portion thereof will not be peeled off during the blast process.

Next, as shown in FIG. 1C, a second layer 3 including a cross-linked polymer material which has an excellent resistance to blasting, i.e. an excellent blast-proof property, such as a silicone film, is formed on the first layer 2 at an area of the first layer 2 except for a portion where the groove is to be formed. As the specific method for forming the pattern including the area except for a portion where the groove is to be formed, printing methods such as a screen printing and a transfer method can be used. Further, a photo etching method using a photosensitive polymer can be used. It is desirable that the film thickness of the second layer 3 is thicker than the first layer 2 (for example, about 30 micrometers), so that the second layer 3 does not wear out before the layers 2, 3 and the substrate 1 are cut to the target depth of the groove by the blast process.

Next, as shown in FIGS. 1D1, 1D2 and 1D3, fine particles such as alumina powder are sprayed by a blast apparatus 5 from above the second layer 3 and thus, a blast process is performed. By this process, the portion of the first layer 2 and the ceramic substrate 1 where the groove is to be formed is cut.

Next, as shown in FIG. 1E, the first layer 2 is dissolved by the organic solvent, and thereby, the second layer 3 is peeled off and removed from the ceramic substrate 1. After the blast process, normally a washing process must be performed to remove the waste material which was cut. However, in the present preferred embodiment, since the second layer 3 is easily peeled off by applying the organic solvent, the washing process is not necessary.

Accordingly, the ceramic substrate 1 which includes the groove 4 as shown in FIG. 1F can be obtained.

The accuracy of the process of forming the groove 4 is based on the pattern accuracy of the second layer 3. Especially, the accuracy of a screen printing method has been improving to the level of about (+/–)0.05 mm to about 0.1 mm in recent years. Compared with the conventional process of forming the groove, i.e., performing a press process in the green sheet formation stage and then performing a baking process, the accuracy of forming the groove 4 according to preferred embodiments of the present is remarkably improved.

In the case of the printing method, since the number of the processes required is reduced compared with the sand blast process using the conventional photosensitive film, the total number of processes required to form the groove is reduced and an apparatus also becomes simple.

Moreover, if several ceramic substrates (mother substrates) are aligned and arranged by a jig or positioning member, and a printing process, a blast process, and a peeling process are performed on these substrates simultaneously, mass production is achieved even if a small-sized component is being produced.

It is noted that a photosensitive resin can be used for the second layer 3. In this case, the pattern forming is completed by forming the second layer 3 on substantially the entire surface of the first layer 2, exposing with a mask on the second layer 3, and performing a etching process. In this case, the number of processes increases compared with the printing method. However, it is possible to improve pattern accuracy even more.

The mother substrate used in preferred embodiments of the present invention is not restricted to a planar shape. The mother substrate may also have a flat surface, such as a tubular shape, or a concave curved surface.

Moreover, the shape of the groove is not restricted to an island-shaped groove but may be a continuous or discontinuous linear slot shape. The shape of the groove is not limited to any particular shape and can be any of a plurality of shapes.

While the invention has been particularly shown and described with reference to preferred embodiments thereof, it will be understood by those skilled in the art that the forgoing and other changes in form and details may be made therein without departing from the spirit of the invention.

What is claimed is:

1. A method of producing a chip-type piezoelectric resonator, comprising the steps of:

providing a piezoelectric mother substrate in which a groove is to be formed:

forming a first layer on a surface of the piezoelectric mother substrate, said first layer including a chain-polymer material which is soluble in an organic solvent;

forming a second layer on said first layer except for a portion where said groove is to be formed, said second layer including a chain-polymer material having blast-resistancy;

forming said groove by cutting said first layer and said piezoelectric mother substrate at the portion where said groove is to be formed, by performing a blast process; and removing said first and second layers from said piezoelectric mother substrate by dissolving said first layer by applying the organic solvent thereto so as to produce the chip-type piezoelectric resonator.

2. The method according to claim 1, wherein said mother substrate comprises one selected from the group consisting of a ceramic substrate, a glass substrate, a printed circuit board, a wafer and a stone.

3. The method according to claim 2, wherein said first layer comprises thermoplastic resin.

4. The method according to claim 1, wherein said first layer comprises thermoplastic resin.

5. The method according to claim 4, wherein said second layer comprises thermosetting resin of silicone or urethane.

6. The method according to claim 3, wherein said second layer comprises thermosetting resin of silicone or urethane.

7. The method according to claim 2, wherein said second layer comprises thermosetting resin of silicone or urethane.

8. The method according to claim 1, wherein said second layer comprises thermosetting resin of silicone or urethane.

9. The method according to claim 1, wherein the second layer includes a cross-linked polymer material.

10. The method according to claim 1, wherein the first layer has a thin film shape having a thickness of about 5 micrometers to about 10 micrometers.

11. The method according to claim 1, wherein a film thickness of the second layer is greater than a film thickness of the first layer.

12. The method according to claim 1, wherein the blast process includes a sand blasting process.

13. The method according to claim 1, wherein the blast process includes a water blasting process.

14. The method according to claim 1, wherein the second layer includes a photosensitive resin.

15. The method according to claim 1, wherein the mother substrate has a flat surface or a concave curved surface.

16. The method according to claim 1, wherein the first layer is formed via an ER ink printing process.

17. The method according to claim 1, wherein the second layer is formed via a silicone printing process.

18. The method according to claim 1, wherein the blast process includes applying a material against the second layer from above the second layer.

19. The method according to claim 1, wherein the first layer does not have the blast resistancy.

20. The method according to claim 1, wherein the second layer is not soluble in the organic solvent.

* * * * *